United States Patent [19]

Soubeyrand et al.

[11] Patent Number: 5,698,262
[45] Date of Patent: Dec. 16, 1997

[54] METHOD FOR FORMING TIN OXIDE COATING ON GLASS

[75] Inventors: Michel J. Soubeyrand, Holland, Ohio; Anthony C. Halliwell, Formby, England

[73] Assignees: Libbey-Owens-Ford Co., Toledo, Ohio; Pilkington PLC, St. Helens, England

[21] Appl. No.: 642,921

[22] Filed: May 6, 1996

[51] Int. Cl.⁶ .............................. C23C 16/00; B05D 5/12
[52] U.S. Cl. ...................... 427/255.3; 427/255.2; 427/255.1; 427/255; 427/109; 427/166; 427/167; 427/419.3; 65/60.52
[58] Field of Search .................. 427/255.3, 255.2, 427/255.1, 255, 109, 166, 167, 419.3; 65/60.52

[56] References Cited

U.S. PATENT DOCUMENTS

| | | |
|---|---|---|
| Re. 31,708 | 10/1984 | Gordon . |
| Re. 34,114 | 10/1992 | Lindner . |
| 2,118,795 | 5/1938 | Littleton . |

(List continued on next page.)

FOREIGN PATENT DOCUMENTS

| | | |
|---|---|---|
| 1 261 686 | 9/1989 | Canada . |
| 027 403 | 2/1984 | European Pat. Off. . |
| 112 780 | 7/1984 | European Pat. Off. . |
| 132 024 | 1/1985 | European Pat. Off. . |
| 158 399 | 10/1985 | European Pat. Off. . |
| 186 481 | 5/1990 | European Pat. Off. . |
| 50-61415 | 5/1975 | Japan . |
| 50-61416 | 5/1975 | Japan . |
| 53-17946 | 2/1981 | Japan . |
| 1-236525 | 9/1989 | Japan . |
| 142000 | 2/1962 | U.S.S.R. . |
| 604878 | 7/1948 | United Kingdom . |
| 632256 | 11/1949 | United Kingdom . |
| 705934 | 3/1954 | United Kingdom . |
| 965792 | 8/1964 | United Kingdom . |
| 1101731 | 1/1968 | United Kingdom . |
| 1211006 | 11/1970 | United Kingdom . |
| 1354745 | 5/1974 | United Kingdom . |
| 1454567 | 11/1976 | United Kingdom . |
| 1516032 | 6/1978 | United Kingdom . |
| 1517341 | 7/1978 | United Kingdom . |

(List continued on next page.)

OTHER PUBLICATIONS

Karlsson et al., Optical Selectivity & Crystallization In Pyrolitic $SnO_2$–Films, Physica Scripta 25, 1981.
Karlsson et al., Influence Of Spray Conditions & Dopants On Highly Conducting Tin Dioxide Films, *Journal Of Thermal Insulation*, 1983.
Blocher, Coating of Glass By Chemical Vapor Deposition, *Thin Solid Films*, 1981.
Shanthi et al., Dopant Effects In Sprayed Tim Oxide Fims, *Elsevier Sequoia*, 1981.
Groth et al., Thermal Insulation Of Sodium Lamps, *Philips Technical Review*, 1965.
Ivanthov et al., Influence Of Impurities On The Structure And Optical Properties Of $SnO_2$ Films, 1979.
Karlsson et al., Heat–Transport & Solar Transmission Through Windows With Low–Emitting Coatings, *Journal Of Thermal Insulation*, 1983.
Kane et al., Chemical Vapor Deposition Of Transparent, Electrically Conduductive Tin Oxide Films Formed From Dibutyl Tin Diacetate, J. Electrochem Soc., 1975.
Kryzhanovskii et al., Use Of Organofluorine Compounds For Increasing The Conductivity, Of Stannic Oxide And Indium Oxide Layers, *Zhurnal Prikladnoi Khimii*, 1966.
Kuznetsov et al., Films Of Semiconduction Tin Dioxide With Increased Conductivity, *Journal Of Applied Chemistry Of The USSR*, 1959.
Manifacier et al., Optical & Electrical Properties Of $SnO_2$ Thin Films In Relation To Their Stoichiometric Deviation And Their Crystalline Structure, *Thin Solid Films*, 1977.
Manifacier et al., $In_2O_3$: (sn) AN $SnO_2$: (F) Films—Application To Solar Energy Conversion; Part 1—Preparation And Characterization, *Mat. Res. Bull.*, 1979.
Manifacier et al., Part II—Electrical And Optical Properties, *Mat. Res. Bill.*, 1979.
Manifacier et al., Deposition Of $In_2O_3$–$SnO_2$ Layers On Glass Substrates Using A Spraying Method, *Thin Solid Films*, 1981.
Manifacier, Thin Metallic Oxides As Transparent Conductors, *Thin Solid Films*, 1982.
Paul et al., On The Preparation & Acceptor Propoerties Of (2,2,2–Trifluoroethoxy) Trichlorotin (IV) and (2,2,2–Trifluoroethoxy) Tetrachloroantimony (V), *Journal Of Inoranic & Nuclear Chemistry Including Bio–Inrganic Chemistry*, 1976.
Reddy et al., Optical & Electrical Properties Of $SnO_2$ Films Prepared By Chemical Vapour Deposition, *Bull Mater. Sci.*, 1986.
Sara et al., Chlorotin Carboxylates By Direct Substitution On Tin Tetrachloride, 1973.
Shepherd, Vapor Phase Deposition & Etching Of Silicon, *Journal Of The Electrochemical Society*, 1965.
Advani et al., A Theromodynamic Analysis Of The Deposition Of $SnO_2$ Thin Films From The Vapor Phase, *Thin Solid Films*, 1979.
Chopra et al., Transparent Conductors—A Status Review, *Then Solid Films*, 1983.
Shanthi et al., Electrical & Optical Properties Of Tin Oxide Films Doped With F and (Sb + F), *American Institute Of Physics*, 1981.
Ghostagor, Mechanism Of CVD Thin Film $SnO_2$ Formation, J. Electrochem Soc: *Solid State Science*, 1978.

*Primary Examiner*—Roy V. King
*Attorney, Agent, or Firm*—Marshall & Melhorn

[57] ABSTRACT

Fluorine doped tin oxide coatings on glass are prepared by providing a uniform, vaporized reactant mixture containing an organotin compound, HF, water and oxygen, and delivering the reactant mixture to the surface of the hot ribbon of glass, where the compounds react to form the fluorine doped tin oxide coating. The fluorine doped tin oxide coatings applied in accordance with the invention exhibit lower sheet resistance, and improved uniformity in sheet resistance over the coated surface of the glass.

19 Claims, No Drawings

U.S. PATENT DOCUMENTS

| | | |
|---|---|---|
| 2,429,420 | 10/1947 | McMaster . |
| 2,556,346 | 9/1951 | Lytle et al. . |
| 2,567,331 | 9/1951 | Gaiser et al. . |
| 2,583,000 | 1/1952 | Lytle . |
| 2,614,944 | 10/1952 | Lytle . |
| 2,617,741 | 11/1952 | Lytle . |
| 3,019,136 | 1/1962 | Auffenorde et al. . |
| 3,107,177 | 10/1963 | Saunders et al. . |
| 3,385,830 | 5/1968 | Orde et al. . |
| 3,420,693 | 1/1969 | Scholes . |
| 3,644,741 | 2/1972 | Ovshinsky . |
| 3,647,531 | 3/1972 | Matsushita et al. . |
| 3,658,583 | 4/1972 | Ogawa et al. . |
| 3,677,814 | 7/1972 | Gillery . |
| 3,679,949 | 7/1972 | Uekusa et al. . |
| 3,759,743 | 9/1973 | Menke . |
| 3,775,453 | 11/1973 | Mazidyasni et al. . |
| 3,781,315 | 12/1973 | Pepe et al. . |
| 3,836,444 | 9/1974 | Codet et al. . |
| 3,841,858 | 10/1974 | Akashi et al. . |
| 3,944,684 | 3/1976 | Kane et al. . |
| 3,949,146 | 4/1976 | Kane et al. . |
| 4,005,468 | 1/1977 | Tanimura et al. . |
| 4,010,291 | 3/1977 | Katsube et al. . |
| 4,057,480 | 11/1977 | Alder . |
| 4,058,430 | 11/1977 | Suntola et al. . |
| 4,069,630 | 1/1978 | Chess et al. . |
| 4,093,636 | 6/1978 | Bost et al. . |
| 4,123,244 | 10/1978 | Leclercq et al. . |
| 4,130,673 | 12/1978 | Larkin . |
| 4,144,362 | 3/1979 | Larkin . |
| 4,146,657 | 3/1979 | Gordon . |
| 4,187,336 | 2/1980 | Gordon . |
| 4,188,199 | 2/1980 | Van Laethem et al. . |
| 4,206,452 | 6/1980 | Blasucci . |
| 4,213,594 | 7/1980 | Pietsch et al. . |
| 4,235,945 | 11/1980 | Wagner et al. . |
| 4,252,841 | 2/1981 | Kinugawa et al. . |
| 4,254,046 | 3/1981 | Franz et al. . |
| 4,263,335 | 4/1981 | Wagner et al. . |
| 4,265,974 | 5/1981 | Gordon . |
| 4,293,594 | 10/1981 | Yoldas et al. . |
| 4,308,316 | 12/1981 | Gordon . |
| 4,310,567 | 1/1982 | Tabata et al. . |
| 4,325,987 | 4/1982 | Kalbskopf et al. . |
| 4,325,988 | 4/1982 | Wagner . |
| 4,329,379 | 5/1982 | Terneu et al. . |
| 4,329,418 | 5/1982 | Kny et al. . |
| 4,329,699 | 5/1982 | Ishihara et al. . |
| 4,330,318 | 5/1982 | Van Cauter et al. . |
| 4,335,195 | 6/1982 | Niskigaki et al. . |
| 4,336,295 | 6/1982 | Smith . |
| 4,349,371 | 9/1982 | Van Laethem et al. . |
| 4,349,425 | 9/1982 | Miyake et al. . |
| 4,351,267 | 9/1982 | Kalbskopf et al. . |
| 4,370,028 | 1/1983 | Bernhardt . |
| 4,374,778 | 2/1983 | Plum et al. . |
| 4,377,613 | 3/1983 | Gordon . |
| 4,387,133 | 6/1983 | Ichikawa et al. . |
| 4,387,134 | 6/1983 | Kalbskopf et al. . |
| 4,389,234 | 6/1983 | Lindner . |
| 4,389,238 | 6/1983 | Kaufman . |
| 4,399,015 | 8/1983 | Endo et al. . |
| 4,408,837 | 10/1983 | Kozaki et al. . |
| 4,416,933 | 11/1983 | Antson et al. . |
| 4,419,386 | 12/1983 | Gordon . |
| 4,419,570 | 12/1983 | Kalbskopf et al. . |
| 4,423,403 | 12/1983 | Miyake et al. . |
| 4,431,764 | 2/1984 | Yoshizumi . |
| 4,444,863 | 4/1984 | Sano et al. . |
| 4,446,815 | 5/1984 | Kalbskopf et al. . |
| 4,462,883 | 7/1984 | Hart . |
| 4,476,158 | 10/1984 | Baumberger et al. . |
| 4,497,700 | 2/1985 | Groth et al. . |
| 4,500,264 | 2/1985 | Lindner . |
| 4,500,567 | 2/1985 | Kato et al. . |
| 4,530,857 | 7/1985 | Lindner . |
| 4,547,400 | 10/1985 | Middleton et al. . |
| 4,548,836 | 10/1985 | Middleton et al. . |
| 4,557,561 | 12/1985 | Schneider et al. . |
| 4,568,578 | 2/1986 | Arfsten et al. . |
| 4,575,317 | 3/1986 | Lindner . |
| 4,579,638 | 4/1986 | Scherber . |
| 4,583,920 | 4/1986 | Lindner . |
| 4,584,236 | 4/1986 | Colmon et al. . |
| 4,590,096 | 5/1986 | Lindner . |
| 4,600,654 | 7/1986 | Lindner . |
| 4,601,917 | 7/1986 | Russo et al. . |
| 4,605,565 | 8/1986 | Nath . |
| 4,668,268 | 5/1987 | Lindner et al. . |
| 4,696,837 | 9/1987 | Lindner et al. . |
| 4,726,319 | 2/1988 | Lindner . |
| 4,731,256 | 3/1988 | Russo et al. . |
| 4,731,462 | 3/1988 | Russo et al. . |
| 4,737,388 | 4/1988 | Lindner . |
| 4,743,506 | 5/1988 | Russo et al. . |
| 4,771,015 | 9/1988 | Kanai ........................... 437/109 |
| 4,775,552 | 10/1988 | Russo et al. . |
| 4,788,079 | 11/1988 | Lindner . |
| 4,853,257 | 8/1989 | Henery . |
| 4,857,095 | 8/1989 | Brown . |
| 4,863,358 | 9/1989 | Lindner . |
| 4,928,627 | 5/1990 | Lindner . |
| 5,102,691 | 4/1992 | Russo et al. . |
| 5,122,394 | 6/1992 | Lindner . |
| 5,140,940 | 8/1992 | Lindner . |

FOREIGN PATENT DOCUMENTS

| | | |
|---|---|---|
| 1520124 | 8/1978 | United Kingdom . |
| 1523991 | 9/1978 | United Kingdom . |
| 2015983 | 9/1979 | United Kingdom . |
| 2026454 | 7/1980 | United Kingdom . |
| 2044137 | 10/1980 | United Kingdom . |
| 2068936 | 8/1981 | United Kingdom . |
| 2068934 | 9/1981 | United Kingdom . |
| 2069992 | 9/1981 | United Kingdom . |
| 2078213 | 1/1982 | United Kingdom . |
| 2033357 | 1/1983 | United Kingdom . |
| 2139612 | 3/1987 | United Kingdom . |

METHOD FOR FORMING TIN OXIDE COATING ON GLASS

FIELD OF THE INVENTION

The present invention relates generally to a method for forming a tin oxide coating on glass, and more particularly, to a process for preparing a tin oxide coating doped with fluorine on a hot glass substrate by chemical vapor deposition.

BACKGROUND OF THE INVENTION

Typically, coated glass articles are produced by continuously coating a glass substrate while it is being manufactured in a process known in the art as the "Float Glass Process". This process involves casting glass onto a molten tin bath which is suitably enclosed, then transferring the glass, after it has sufficiently cooled, to take-away rolls which are aligned with the bath, and finally cooling the glass as it advanced across the rolls, initially through a lehr and thereafter while exposed to the ambient atmosphere. A non-oxidizing atmosphere is maintained in the float portion of the process, while the glass is in contact with the molten tin bath, to prevent oxidation. An air atmosphere is maintained in the lehr. The chemical vapor deposition (CVD) of various coatings may be conveniently performed in the bath or the lehr, or even in the transition zone therebetween, by contacting the surface of the hot glass with chemical vapor containing reactants which pyrolytically decompose to form the metal oxide coating. This, of course, requires that the chemical reactants have vaporization temperatures below their thermal decomposition temperatures. Several tin compounds exist which may be vaporized to prepare a tin oxide coating on glass by CVD technology.

The desirable performance characteristics of tin oxide coatings on glass, such as for example low emissivity, low sheet resistance, high light transmittance, high infrared reflectivity, etc., are improved by the incorporation into the tin oxide coating of a dopant. Several materials have been used in the prior art as dopants, but the most effective for tin oxide is the element fluorine. Fluorine may be supplied to the deposition reaction in the form of an organotin fluoride, or as a separate fluorine-containing compound which reacts in conjunction with a tin compound.

The physical form of the reactants employed in glass coating processes is generally a liquid, solid, vaporized liquid or solid, liquid or solid dispersed in a carrier gas mixture, or vaporized liquid or solid dispersed in a carrier gas mixture. The chemical vapor deposition process generally employs a vaporized liquid or solid, which is typically dispersed in a carrier gas mixture.

Both organic and inorganic tin compounds have been used for the deposition by chemical vapor deposition of fluorine doped tin oxide coatings. Thus, for example U.S. Pat. No. 4,329,379 discloses a process for forming a fluorine doped tin oxide coating on a hot glass substrate by contacting the glass with the vaporized reactants of a tin tetrachloride, hydrofluoric acid (HF), air and water. Similarly, U.S. Pat. No. 4,387,134 teaches that fluorine doped tin oxide films have sheet resistances of 1–10 ohm/square may be produced from a combination of vaporized water, methanol, HF, stannic chloride and $H_2/N_2$ gases.

Alternatively, other generally preferred methods for applying doped tin oxide coatings onto glass involve vaporizing a mixture of an organic tin compound and a fluorine-containing compound, then directing these vaporized reactants onto the surface of a hot glass substrate. Such a method is disclosed in U.S. Pat. No. 4,293,594, which additionally suggests the use of an oxygen-containing carrier gas.

Likewise, in U.S. Pat. No. 4,590,096, a chemical vapor deposition method of forming fluorine doped tin oxide coatings is disclosed using a mixture of an organotin compound, an organic fluorine dopant, air and water vapor. In the method, the gas stream is said to contain sufficient water vapor such that the relative humidity of the gas stream at 18° C. is about 6% to 100%.

In U.S. Pat. No. 4,325,987, a CVD method is disclosed in which a gaseous mixture of tin tetrachloride and water vapor in a carrier gas containing at least 30% hydrogen is delivered to the glass surface. A separate gaseous mixture of HF and water vapor may also be delivered to the glass surface. While the preferred tin compound is stated to be tin tetrachloride and this is the only tin compound for which examples are given, mention is made of the possibility of using volatile tin compounds of the type $Sn(Alk)_4$ where Alk denotes a lower alkyl radical and dibutyl-diacetyl tin. As there is a lack of any information on how to practice the method of the invention with the mentioned organic tin compounds, the disclosure does not contribute anything to the advancement of the state of the art in this regard.

It must be noted that the prior art referred to hereinabove has been collected and examined only in light of the present invention as a guide. It is not to be inferred that such diverse art would otherwise be assembled absent the motivation provided by the present invention.

It would be desirable to improve the heretofore known methods for applying a fluorine doped tin oxide coating to a surface of a hot glass substrate by a CVD process, and thereby enhance the low sheet resistance and uniformity of the sheet resistance of the coated glass product. It would also be desirable to provide a method for applying a fluorine doped tin oxide coating to a surface of a hot glass substrate which was less costly than the heretofore known methods.

SUMMARY OF THE INVENTION

The present invention is directed toward a chemical vapor deposition process for applying a fluorine doped tin oxide coating to a surface of a hot glass substrate. Surprisingly, it has been discovered that the desirable properties of fluorine doped tin oxide coatings on glass are improved by utilizing a process comprising the steps of:

A) providing a hot glass substrate, including a surface upon which a fluorine doped tin oxide coating is to be deposited;

B) providing a uniform, vaporized reactant mixture containing an organotin compound, hydrogen fluoride, oxygen and water; and C) delivering the vaporized reactant mixture to the surface of the hot glass substrate;

wherein the uniform, vaporized reactant mixture reacts to deposit a coating of fluorine doped tin oxide on the surface of the hot glass substrate.

In a preferred embodiment, a sodium diffusion barrier, preferably a layer of silica, is applied to the surface of the glass substrate prior to the deposition of the fluorine doped tin oxide. The process of the present invention is particularly suitable for the production of glass having a fluorine doped tin oxide coating, useful for energy efficient architectural windows, airplane or automobile windows, and a variety of optical and electronic devices.

DETAILED DESCRIPTION OF THE PREFERRED EMBODIMENT

Tin oxide coatings doped with fluorine may be deposited onto the surface of a hot glass substrate by a process generally known in the art as chemical vapor deposition (CVD). In accordance with this process, the reactants are combined so as to form a uniform, vaporized reactant stream which is delivered to the surface of the hot glass substrate, wherein the vaporized reactant stream reacts to deposit a coating of fluorine doped tin oxide on the surface of the hot glass substrate. In the oxidizing atmosphere, which must exist at the surface of the hot glass, the organotin coating compounds pyrolytically decompose to form the tin oxide coating.

The process is typically conducted during the manufacture of glass by the float glass process, and occurs in the float metal bath, the lehr, or in the transition zone between the bath and the lehr, while the glass is still hot. The glass substrate is generally provided at a temperature in the range from about 750° F. to about 1500° F. These are typical temperatures for glass during various stages as it is manufactured by the float glass process.

The glass substrates suitable for use in the process according to the present invention include any of the conventional glass substrates known in the art for the preparation of coated glass articles. A typical glass substrate, used in the manufacture of vehicle windows and plate glass, is commonly referred to as soda-lime-silica glass. Other suitable glasses may be generally designated as alkali-lime-silica glass, boro-silicate glass, alumino-silicate glass, boro-alumino silicate glass, phosphate glass, fused silica, etc., as well as combinations thereof. A preferred glass is soda-lime-silica glass.

The CVD reactant stream of this invention includes an organotin coating compound which is vaporized and conveyed to a point at or near the surface of the advancing glass ribbon. Suitable organotin compounds useful for practicing the invention include, without limitation to those specifically recited, dimethyltin dichloride, diethyltin dichloride, dibutyltin diacetate, tetramethyl tin, methyltin trichloride, triethytin chloride, trimethyltin chloride, ethyltin trichloride, propyltin trichloride, isopropyltin trichloride, sec-butyltin trichloride, t-butyltin trichloride, phenyltin trichloride, carbethoxyethyltin trichloride, and the like, as well as combinations thereof. These compounds are generally well known in the art of CVD technology, as well as commercially available, as precursors for applying a tin oxide coating on hot glass. A preferred organotin compound is dimethyltin dichloride. The organotin compound, and optionally a carrier gas, oxidizer, stabilizer, hydrocarbon, inert gas, and the like, are vaporized to form a gaseous organotin reactant stream. The term gaseous organotin reactant stream, as used herein, typically comprises a vaporized organotin compound, an oxidizer, and an inert carrier gas.

The vaporized organotin compound may be prepared by any of the procedures generally known in the art, such as for example the vaporization of dispersed or fluidized organotin powders or the vaporization of organotin particles in a packed bed by a hot carrier gas stream, or the injection of a solubilized organotin compound into a hot carrier gas stream, or the bubbling of a carrier gas through a liquid organotin compound. These processes are more fully set forth in U.S. Pat. Nos. 3,852,098; 2,780,553; 4,351,861; 4,571,350; 3,970,037; 4,212,663; and 4,261,722, which are incorporated herein in their entirety by reference thereto. A preferred method for preparing the reactant stream containing the vaporized organotin compound is to vaporize the compound in a thin film evaporator in the presence of a blend gas, as is disclosed, for example, in U.S. Pat. No. 5,090,985, which is also incorporated herein in its entirety by reference thereto. As noted above, this gaseous stream, which generally comprises an inert carrier gas such as helium, nitrogen, or argon, or mixtures thereof, may optionally contain oxidizers such as water or oxygen. Preferred carrier gases are helium and nitrogen, and mixtures thereof, containing oxygen as an oxidizer. The resultant reactant stream containing the vaporized organotin compound is generally heated to a temperature from about 250° F. to about 450° F., then conveyed to the reaction zone at the surface of the hot glass substrate.

Gaseous hydrogen fluoride or hydrofluoric acid ("HF" is used herein to refer to either hydrogen fluoride gas or hydrofluoric acid) is combined with the vaporized organotin compounds. A separate HF containing reactant stream is formed generally comprised of HF and a carrier, preferably water vapor. The addition of water to the HF-containing reactant stream also lowers the emissivity of the coated glass, while increasing the growth rate of the fluorine doped tin oxide deposited. The HF-containing reactant stream may additionally contain conventional adjuvants such as for example helium, nitrogen, or argon, and mixtures thereof, as well as oxidizers such as for example oxygen.

The HF-containing reactant stream is combined with the organotin reactant stream at a point prior to delivery of the reactants to the surface of the hot glass substrate upon which the coating is to be deposited, but preferably in relatively close proximity thereto. The reactant stream containing the HF may be prepared by vaporizing the compound using one of the methods discussed hereinabove relative to the vaporization of the organotin, or by providing the HF as a gas. The vaporized reactant stream containing the HF may be combined with the reactant stream containing the vaporized organotin compound by blending the two gaseous streams prior to delivery to the surface of the hot glass substrate. Alternatively, the HF-containing reactant stream in liquid or solution form may be injected into the hot reactant stream containing the vaporized organotin compound, thereby vaporizing the fluorine-containing solution or liquid compound. After combination, the vaporized reactants of organotin, HF, water and oxygen are delivered to the surface of the hot glass, where they react together to deposit thereon a coating of fluorine doped tin oxide.

In a preferred embodiment, the organotin reactant stream is formed by vaporizing dimethyltin dichloride and an inert carrier gas, such as nitrogen, helium or a mixture thereof in an evaporator such as that described above. The resulting gaseous stream is then combined with gaseous oxygen. At the same time, HF and water are combined in a second evaporator, and the resulting gaseous reactant stream of HF and water vapor is combined with the gaseous organotin reactant stream to form a uniform, gaseous reactant stream. The uniform, gaseous reactant stream is delivered to the surface of the hot glass substrate, wherein a coating of fluorine doped tin oxide is deposited on the surface of the hot glass substrate. The uniform, gaseous reactant stream may be delivered to the surface of the glass by any suitable coating device. One preferred coating device is illustrated in U.S. Pat. No. 4,504,526, which is incorporated herein in its entirety by reference thereto.

The uniform, gaseous reactant mixture which is delivered to the surface of the hot glass substrate in accordance with the invention preferably includes (all percentages being mole %) from about 10 to about 60% oxygen, from about 2 to about 50 % water, and from about 0.2 to about 2% HF, and most preferably includes from about 30 to about 50% oxygen, from about 15 to about 35% water, and from about 0.5 to about 1.5% HF. The uniform, gaseous reactant mixture also includes an organotin compound, the desired concentration of which is a function of the desired thickness of the tin oxide coating and the line speed of the substrate. Thus, as will be appreciated by those skilled in the art, the organotin is provided in the gaseous reactant mixture in an amount sufficient to apply a coating of the desired thickness at the desired line speed of the substrate. For typical commercial operations, the gaseous reactant mixture will generally include from about 0.01 to about 8% of the organotin.

It has also been noted to be preferable, when forming a fluorine doped tin oxide coating in accordance with this invention, to apply a layer of a material which acts as a sodium diffusion barrier between the glass substrate and the fluorine doped tin oxide coating. Coated glass articles have been found to exhibit lower emissivity, lower sheet resistance and lower haze when the fluorine doped tin oxide coating deposited in accordance with the invention is applied to the glass with a sodium diffusion layer therebetween, as opposed to directly on the glass. This sodium diffusion layer is preferably formed of silica. The layer of silica is preferably formed using conventional CVD techniques.

In a most preferred embodiment, a thin film of tin oxide is first deposited on the surface of the hot glass substrate, with the thin film of silica deposited thereover, so that an underlayer structure of tin oxide/silica is formed intermediate the glass and the subsequently deposited layer of fluorine doped tin oxide. In this embodiment, the silica film not only acts as a sodium diffusion barrier but, in combination with the first (undoped) tin oxide film, helps to suppress iridescence in the resulting coated glass article. The use of such anti-iridescent layers is disclosed in U.S. Pat. No. 4,377,613, which is incorporated herein in its entirety by reference thereto.

It must be noted that the process conditions are not sharply critical for the successful combining and delivering of vaporized reactants according to the present invention. The process conditions described hereinabove are generally disclosed in terms which are conventional to the practice of this invention. Occasionally, however, the process conditions as described may not be precisely applicable for each compound included within the disclosed scope. Those compounds for which this occurs will be readily recognizable by those ordinarily skilled in the art. In all such cases, either the process may be successfully performed by conventional modifications known to those ordinarily skilled in the art, e.g., by increasing or decreasing temperature conditions, by varying the rates of combination of the organotin and HF reactants, by routine modifications of the vaporization process conditions, etc., or other process conditions which are otherwise conventional will be applicable to the practice of the invention.

It will also be noted that the process of the invention may be repeated as desired on a given substrate so as to form a coating consisting of several successive layers, the composition of each of the layers not necessarily being identical. It is of course obvious that for a given flow rate of the reactants, the thickness of a coating layer depends on the rate of movement of the substrate. Under these conditions, the reaction stations may if desired be multiplied by juxtaposing two or more coating devices. In this way, successive layers are superimposed before the layers have had time to cool, producing a particularly homogenous overall coating.

The invention is more easily comprehended by reference to specific embodiments which are representative of the invention. It must be understood, however, that the specific embodiments are provided only for the purpose of illustration, and that the invention may be practiced otherwise than as specifically illustrated without departing from its spirit and scope.

COMPARATIVE EXAMPLE

Dimethyltin dichloride is melted and then vaporized in a thin film evaporator of the type illustrated in U.S. Pat. No. 5,090,985. Helium, as a carrier gas, is simultaneously introduced into the thin film evaporator. The thin film evaporator is equipped with a steam jacket maintained at about 350° F. The resulting mixture of gaseous DMT and helium exits the thin film evaporator and is conveyed along a main reactant line. Gaseous oxygen is introduced into the DMT/He gas stream in the main reactant line. The resultant gas stream continues along the main reactant line.

At the same time, trifluoroacetic acid (TFA) and water are fed into a second thin film evaporator, maintained at about 400° F. The resulting mixture of gaseous TFA and water exits the second thin film evaporator and is fed through a supply line which joins with the main precursor line, combining the TFA/water gas mixture with the DMT/He/$O_2$ gas stream so that the streams are thoroughly mixed to form a uniform, vaporized reactant stream. The final gaseous reactant stream consists of about (all percentages being mole %) 44.2% oxygen, 22.1% water, 30.2% helium, 0.97% TFA, and 2.53% DMT, with the total gas flow of the final gaseous mixture being about 384 standard liters per minute per meter width of the resulting coated glass article.

This vaporized reactant stream is immediately delivered, utilizing the coating device of U.S. Pat. No. 4,504,526, to the surface of a ribbon of glass on which a first thin film of tin oxide and a second thin film of silica had been previously deposited by conventional CVD techniques. The ribbon of glass is moving at a line speed of approximately 466 inches per minute, and is at a temperature of from about 1,100° F. to 1,200° F. The reactant stream reacts at the surface of the hot glass to form a coating of fluorine doped tin oxide overlying the silica and tin oxide films. The thickness of the resulting layer of fluorine doped tin oxide is approximately 3,200 Å.

The sheet resistance is measured in 2 inch increments across the width of the resulting coated glass article. The sheet resistance ranges from 13.3 to 18.0 ohms per square, with an average sheet resistance of 14.4 ohms per square.

EXAMPLE

Dimethyltin dichloride is melted and then vaporized in a thin film evaporator of the type illustrated in U.S. Pat. No. 5,090,985. Helium, as a carrier gas, is simultaneously introduced into the thin film evaporator. The thin film evaporator is equipped with a steam jacket maintained at about 350° F. The resulting mixture of gaseous DMT and helium exits the thin film evaporator and is conveyed along a main reactant line. Gaseous oxygen is introduced into the DMT/He gas stream in the main reactant line. The resultant gas stream continues along the main reactant line.

At the same time, an aqueous solution of HF is fed into a second thin film evaporator, maintained at about 400° F. Additional water is introduced into the second thin film evaporator. The resulting mixture of gaseous HF and water exits the second thin film evaporator and is fed through a supply line which joins with the main precursor line, combining the HF/water gas mixture with the DMT/He/$O_2$ gas stream so that the streams are thoroughly mixed to form a uniform, vaporized reactant stream. The final gaseous mixture consists of about (all percentages being mole %) 42.9% oxygen, 24.6% water, 29.3% helium, 0.70% HF, and 2.5% DMT, with the total gas flow of the final gaseous mixture being about 395 standard liters per minute per meter width of the resulting coated glass article.

This vaporized reactant stream is immediately delivered, utilizing the coating device of U.S. Pat. No. 4,504,526, to the surface of a ribbon of glass on which a first thin film of tin oxide and a second thin film of silica had been previously deposited by conventional CVD techniques. The ribbon of glass is moving at a line speed of approximately 466 inches per minute, and is at a temperature of from about 1,100° F. to 1,200° F. The reactant stream reacts at the surface of the hot glass to form a coating of fluorine doped tin oxide overlying the silica and tin oxide films. The thickness of the resulting layer of fluorine doped tin oxide is approximately 3,200 Å.

The sheet resistance is measured in 2 inch increments across the width of the resulting coated glass article. The sheet resistance ranges from 13.0 to 15.9 ohms per square, with an average sheet resistance of 14.0 ohms per square.

What is claimed is:

1. A chemical vapor deposition process for applying a fluorine doped tin oxide coating to a surface on a hot glass substrate, comprising the steps of:

A) providing a hot glass substrate, including a surface upon which a fluorine doped tin oxide coating is to be deposited;

B) providing a uniform, vaporized reactant mixture containing an organotin compound, hydrogen fluoride, oxygen and water; and C) delivering the vaporized reactant mixture to the surface on the hot glass substrates wherein the uniform, vaporized reactant mixture reacts to deposit a coating of fluorine doped tin oxide on the surface of the hot glass substrate.

2. The process according to claim 1, wherein the glass is selected from the group consisting of soda-lime-silica glass, alkali-lime-silica glass, boro-silicate glass, alumino-silicate glass, phosphate glass, fused silica glass, and combinations thereof.

3. The process according to claim 1, wherein the glass is soda-lime-silica glass.

4. The process according to claim 1, wherein the organotin compound is selected from the group consisting of dimethyltin dichloride, diethyltin dichloride, dibutyltin diacetate, tetra methyl tin, methyltin trichloride, triethytin chloride, trimethyltin chloride, ethyltin trichloride, propyltin trichloride, isopropyltin trichloride, sec-butyltin trichloride, t-butyltin trichloride, phenyltin trichloride, carbethoxyethyltin trichloride, and combinations thereof.

5. The process according to claim 1, wherein the organotin compound is dimethyltin dichloride.

6. The process according to claim 1, wherein the glass substrate is provided at a temperature from about 750° F. to about 1,500° F.

7. The process according to claim 1, wherein the uniform, vaporized reactant mixture additionally comprises one or more compounds selected from the group consisting of helium, nitrogen, argon, and nitrous oxide.

8. The process according to claim 1, further comprising the step of depositing on said surface of said hot glass substrate a layer of a material which acts as a sodium diffusion barrier, so that said material is interposed between said surface of said glass substrate and said fluorine doped tin oxide coating.

9. The process according to claim 8, wherein a layer of silica is deposited on the surface of said hot glass substrate prior to the deposition of said fluorine doped tin oxide coating.

10. The process according to claim 9, wherein said layer of silica is deposited on the surface of said hot glass substrate by a chemical vapor deposition process.

11. The process according to claim 9, wherein a layer of tin oxide is deposited on the surface of said hot glass substrate prior to the deposition of said layer of silica.

12. The process according to claim 1, wherein said gaseous reactant mixture includes from about 0.2 to about 2 mole % hydrogen fluoride.

13. The process according to claim 2, wherein said gaseous reactant mixture includes from about 0.5 to about 1.5 mole % hydrogen fluoride.

14. The process according to claim 1, wherein said gaseous reactant mixture includes from about 2 to about 50 mole % water.

15. The process according to claim 14, wherein said gaseous reactant mixture includes from about 15 to about 35 mole % water.

16. The process according to claim 1, wherein said gaseous reactant mixture includes from about 10 to about 60 mole % oxygen.

17. The process according to claim 16, wherein said gaseous reactant mixture includes from about 30 to about 50 mole % oxygen.

18. A chemical vapor deposition process for applying a fluorine doped tin oxide coating to a surface on a hot glass substrate, comprising the steps of:

A) providing a hot glass substrate at a temperature from about 750° F. to about 1,500° F., including a surface upon which a fluorine doped tin oxide coating is to be deposited;

B) providing a uniform, vaporized reactant mixture containing an organotin compound, from about 0.2 to about 2 mole % hydrogen fluoride, from about 2 to about 50 mole % water, and from about 10 to about 60 mole % oxygen; and C) delivering the vaporized reactant mixture to said surface on the hot glass substrate;

wherein the uniform, vaporized reactant mixture reacts to deposit a coating of fluorine doped tin oxide on the surface of the hot glass substrate.

19. A chemical vapor deposition process for applying a fluorine doped tin oxide coating to a surface on a hot glass substrate, comprising the steps of:

A) providing a hot glass substrate at a temperature from about 750° F. to about 1,500° F., including a surface upon which a fluorine doped tin oxide coating is to be deposited, said surface having a layer of silica applied thereto;

B) providing a uniform, vaporized reactant mixture containing an organotin compound, from about 0.2 to about 2 mole % hydrogen fluoride, from about 2 to about 50 mole % water, and from about 10 to about 60 mole % oxygen; and C) delivering the vaporized reactant mixture to said surface on the hot glass substrate;

wherein the uniform, vaporized reactant mixture reacts to deposit a coating of fluorine doped tin oxide on said layer of silica on the surface of the hot glass substrate.

* * * * *